United States Patent [19]

Charvolin

[11] Patent Number: 4,457,721

[45] Date of Patent: Jul. 3, 1984

[54] CONSTRUCTION KIT FOR ELECTRICAL CIRCUITS

[76] Inventor: Patrice Charvolin, 3 rue Tupin, 69002 Lyon Rhone, France

[21] Appl. No.: 301,792

[22] Filed: Sep. 14, 1981

[30] Foreign Application Priority Data

Sep. 12, 1980 [FR] France .............................. 80 19964

[51] Int. Cl.³ ..................... G09B 23/18; H01R 29/00
[52] U.S. Cl. .................. 434/224; 339/17 C; 339/125 R
[58] Field of Search .............. 434/224, 301; 339/17 C, 339/125 R

[56] References Cited

U.S. PATENT DOCUMENTS

| | | | |
|---|---|---|---|
| 3,062,991 | 11/1962 | Kaidan | 434/301 X |
| 3,145,483 | 8/1964 | Cruz | 434/224 |
| 3,175,304 | 3/1965 | Och et al. | 434/224 |
| 3,514,872 | 6/1970 | Bradley | 434/224 |

FOREIGN PATENT DOCUMENTS 755358 8/1956 United Kingdom ............... 434/224

*Primary Examiner*—William H. Grieb
*Attorney, Agent, or Firm*—Remy J. VanOphem

[57] ABSTRACT

A board including a number of holes is designed to receive junction pieces. These junction pieces include a head and a lug designed for fitting the holes of the plate for mechanical interconnection of said junction pieces to said board. Electrical connectors are provided on each head for interconnection with the terminals of the electronic components. These terminals are held together by lamellas which provide the electric contact and which are connected one with another.

29 Claims, 26 Drawing Figures

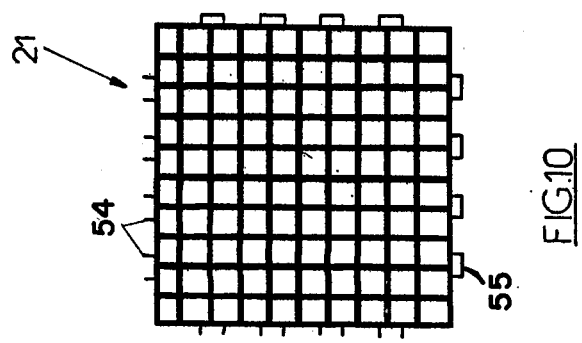
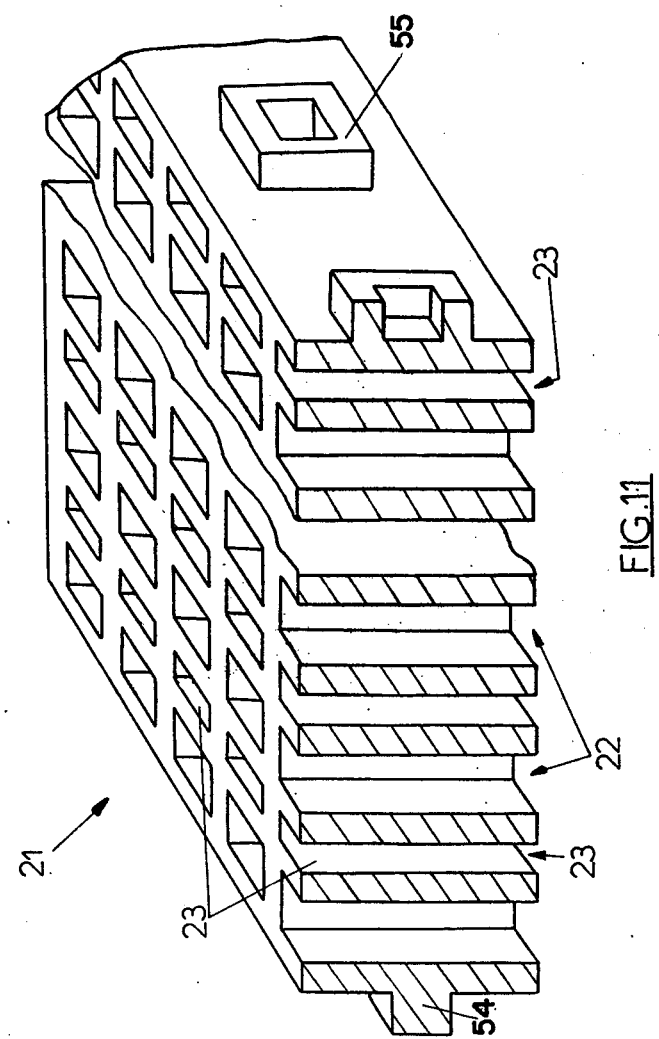

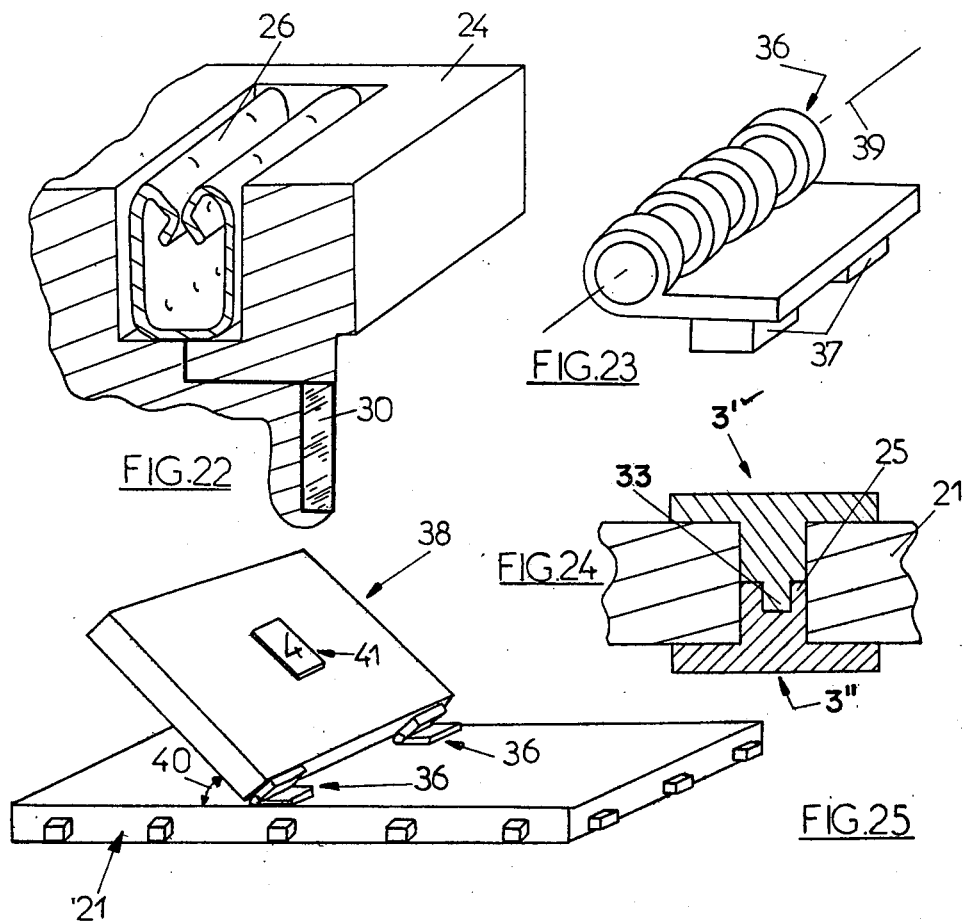
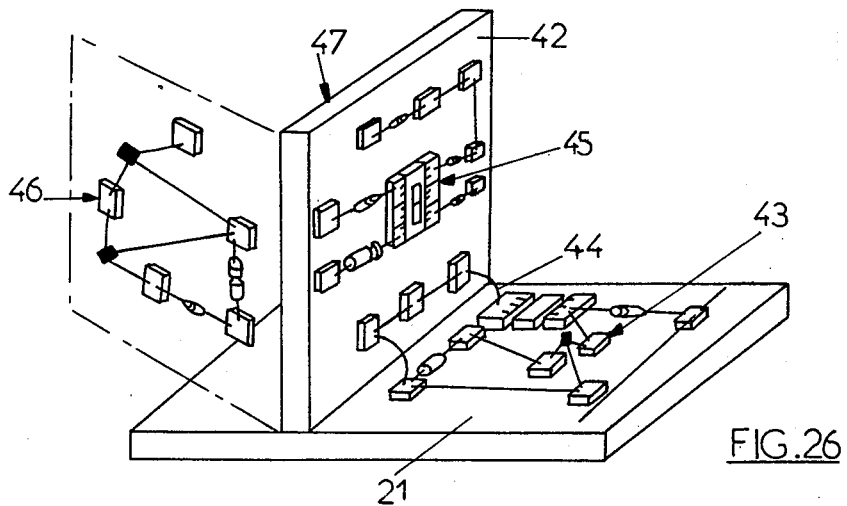

CONSTRUCTION KIT FOR ELECTRICAL CIRCUITS

BACKGROUND OF THE INVENTION

This invention pertains to a kit designed for the construction of electric circuits and particularly to circuit kits to be used in laboratories and in the educational field.

In general, the prior art electric circuits obtained with the usual methods do not accurately reflect the theoretical operating diagram. Furthermore, because soldering is required in the prior art circuits in order to connect the electronic components in these circuits, it is not possible to reuse the components in other circuits, as they may be damaged during an unsoldering operation.

SUMMARY OF THE INVENTION

This invention is designed to eliminate these disadvantages by using a convenient, solderless, complete kit designed for the construction of electric circuits. The electric circuit thus obtained is the exact replica of its theoretical diagram and the electronic components used may be reused on other circuits.

The complete kit, designed for the construction of electric circuits, and as called for in the invention, is characterized by the fact that it includes a drilled plate as well as junction pieces which fit in the holes of the plate.

According to another characterization, the plate includes holes which may be staggered.

According to another characterization, the junction pieces include a cylindrical head defined by two parallel planes. Along the axis and below this cylindrical head, a lug is provided to hold the junction piece by frictional contact in one of the holes of the plate. This lug is split in its middle and consists of two truncated cones.

According to another characterization, the heads of the junction pieces are of parallelepiped shape.

According to another characterization, the head of the junction pieces includes a series of connections which are equally spaced and located at a constant distance from the edge of the upper face of the head.

According to another characterization, all of the above connections are connected by a common conductor. This conductor is represented by a solid line which conforms to the shape of the network of connections.

According to another characterization, in the case where the heads of the junction pieces are parallelepiped shaped, the heads include a series of connections which are equally distributed along lines that are parallel to one of the sides of the head.

According to another characterization, the above connections belonging to the same line, parallel with one of the sides of the head, are connected by the same conductor, these conductors being parallel to each other.

According to another characterization, each connection consists of two lamellas which are attached, as by soldering, onto a contact piece connected to the above conductor. The lamellas, the contact piece and the contact piece-conductor connection are made of a conducting material.

According to another characterization, the shape of the lamellas of any given connection are such as to provide an adequate attachment of the electronic components, as well as provide an electric contact between these components and the contact piece.

BRIEF DESCRIPTION OF THE DRAWINGS

The attached, schematic drawing will give a better understanding of the specifications of the invention.

FIG. 10 shows a variation of the support plates, according to a further embodiment of the invention, which may be used with double faced electronic patterns;

FIG. 11 is a large scale illustration of the detail of the elevation represented in FIG. 10;

FIG. 22 shows a detail of the junction piece of FIG. 8, illustrated on FIGS. 16, 17 and 20;

FIG. 23 shows a hinge piece according to the invention;

FIG. 24 is a cross sectional view illustrating the mode of assembly of two junction pieces of the type illustrated in FIGS. 17, 19, 13 and 15 in the case of a double face connection;

FIG. 25 illustrates an application of the invention in the case of a connection including a slanted panel; and FIG. 26 illustrates another type of construction including two support panels, one of which is double faced.

DESCRIPTION OF THE PREFERRED EMBODIMENT

Figure 1:
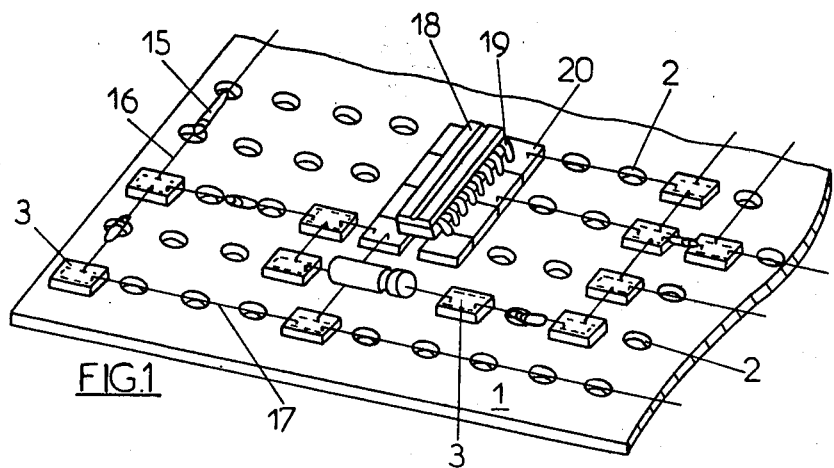
FIG. 1 is a partial elevational view of an electric connection abtained with the kit as described by the invention.
Figure 2:
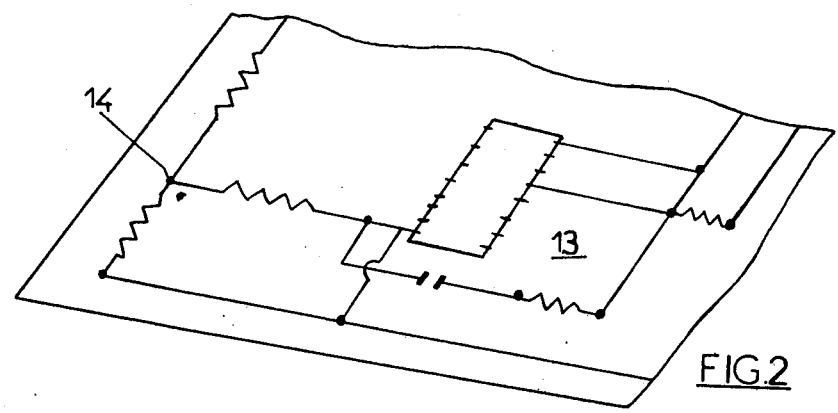
FIG. 2 is a partial elevational view of a connection, as well as a diagram of the circuit represented in FIG. 1.
Figure 3:
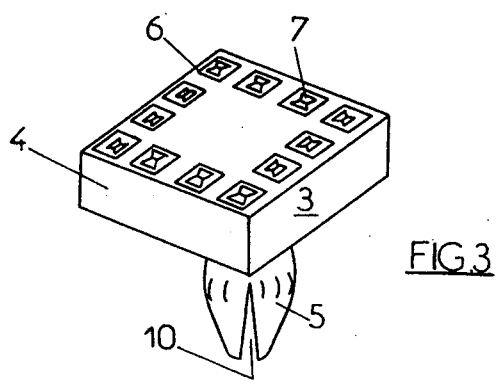
FIG. 3 is an elevational view of a junction piece.
Figure 4:
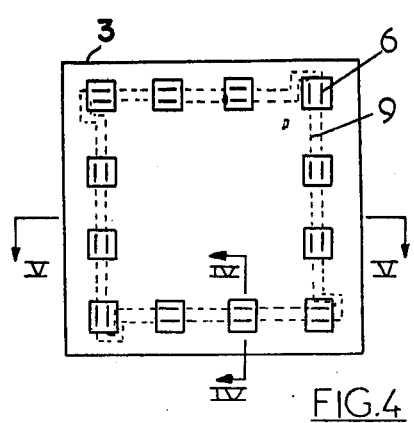
FIG. 4 is a top view of a junction piece, according to one embodiment of the present invention.
Figure 8:
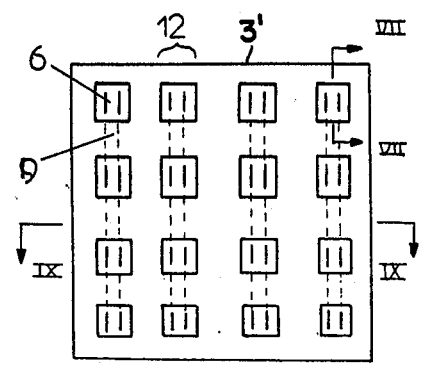
FIG. 8 is a top view of a junction piece, according to another embodiment of the present invention.
Figure 9:
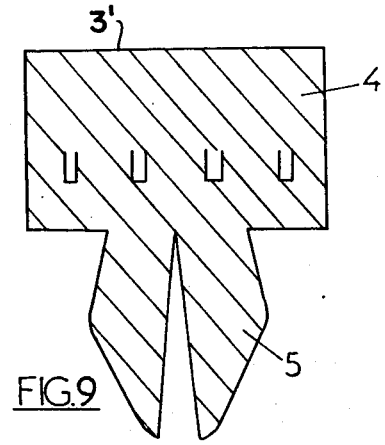
FIG. 9 is a sectional view of a junction piece, taken along line IX—IX of FIG. 8.

With reference to FIGS. 1-4, 8 and 9, the kit, according to the invention, consists of a plate 1, including holes 2, and which can be made of wood of the "isorel" type, and of junction pieces which may be of two types: junction pieces 3 shown in FIGS. 3 and 4, and junction pieces $3^I$, as shown in FIGS. 8 and 9.

The junction piece 3 of FIG. 3 consists of a head 4, an attaching lug 5, a split 10 from its bottom, and connections 6.

Figure 6:
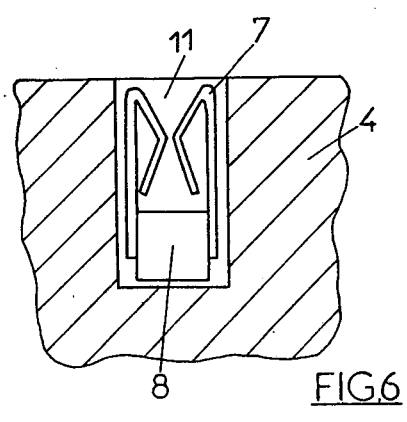
FIG. 6 is a partial sectional view of a connection, taken along line VI—VI of FIG. 4.
Figure 7:
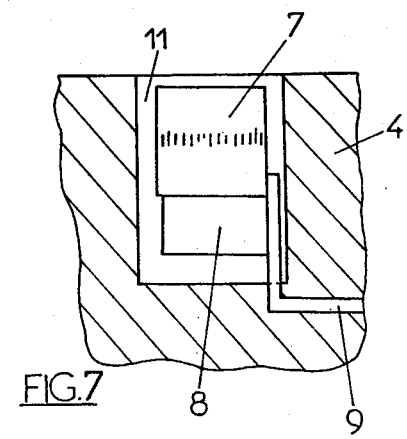
FIG. 7 is a partial sectional view of a connection, taken along line VII—VII of FIG. 8.

With reference to FIGS. 6 and 7, each connection 6 consists of two lamellas 7 which are soldered to a contact piece 8. The connections 6 are connected by a conductor 9 and are housed in the recesses 11 of the head 4.

All of the connections of the junction pieces $3^I$ are connected by the same conductor 9, as shown in FIG. 4. The connections 6 of the junction pieces $3^I$ are connected by conductors 9 so as to be arranged in independent rows of connections 12, no conductor 9 being provided to connect two rows 12, as illustrated in FIG. 8.

The system operates as follows.

In the case of the electric diagram 13 shown in FIGS. 1-3, the plate 1 is selected to have as many junction pieces 3 as the number of nodes 14 of the electric system.

The junction pieces 3 are attached to the plate 1, using the hole 2, by means of their lug 5.

The electronic components 15 are arranged between the various junction pieces 3 following the electric diagram 13, as determined by the circuit diagram. The terminals 16 of these components penetrate the connections 6 of the junction pieces. The remainder of the circuit is obtained by means of tabs 17 attached in the same fashion as the electronic components 15.

The electronic components 18 of the integrated circuit type, are attached by their lugs 19 to the rows 20 of junction pieces 3.

The terminals 16 of the electronic component 15 are locked between both lamellas 7 of the connections 6 so as to obtain a connection providing a permanent electrical contact between these two elements, as shown in FIGS. 1 and 6. The advantages of the kit used for the construction of electric circuits as called for in the invention are the following.

The circuits thus obtained accurately reflect the theoretical electric diagrams. Used in laboratories or in the educational field, these circuits, equipped with the kit according to the invention, allow for a better understanding of their operation.

As modes of the circuits are obtained by solderless connections, their use is more flexible. Furthermore, the electronic components used are not damaged and may be reused on other circuits, and the circuit thus obtained may be easily modified.

Both types of junction pieces may be used jointly with all types of electronic components, such as integrated circuits for instance.

If the contact is lost at any point of the circuits, it is not necessary to discard the plate and its connections which are equivalent to the plate of the usual printed circuits, the defective junction piece being the only part to be discarded.

The connections thus obtained require less connecting wires since a direct liaison is provided from component to component.

It is possible to separate the various functions of a connection.

The above applies more particularly to the wiring patterns called "monoface" or "singlefaced".

The variations illustrated in FIGS. 10 through 26 are specifically designed for doublefaced wiring patterns, such as those in which the electronic components may be arranged on both faces of the same plate. Such a plate 21 is illustrated in detail in FIGS. 10 and 11. This plate may be made of a single molded piece of plastic material for instance. It includes square or rectangular holes 22 and various holes 23 which are arranged in series on both faces. Finally two of the peripheral sides of the plate include male lugs 54 which extend externally and the two other sides include female sleeves 55 designed to receive the male lug 54 of another plate 21. It is therefore possible to assemble, side by side, several plates 21 according to the invention.

Figure 12:
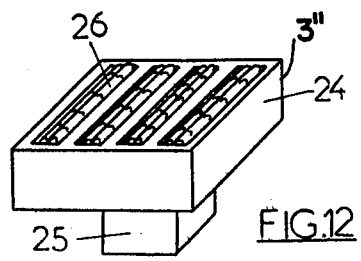
FIGS. 12 and 13 show a variation of the embodiment of the junction piece shown in FIG. 8.
Figure 13:
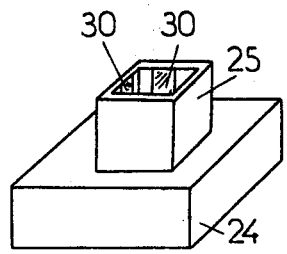

The junction piece $3^{II}$ illustrated on FIGS. 12 and 13 may be used in the same way as that illustrated on FIGS. 8 and 9. The first junction piece, however, shows the following differences when compared to the second one.

Each row of connections 6 is replaced by a single connecting bar 26 which extends practically over the whole length of the head of the junction piece.

The attaching lug 25 is both square and hollow.

Four conducting plates 30 are provided on the internal faces of the attaching lug 25. These plates may be made of metal and each one of them is connected to one of the single connecting bars 26 by means of a metal structure surrounded by the plastic material of the junction pieces $3^{II}$, as more clearly shown in FIGS. 12, 13 and 20.

Figure 5:
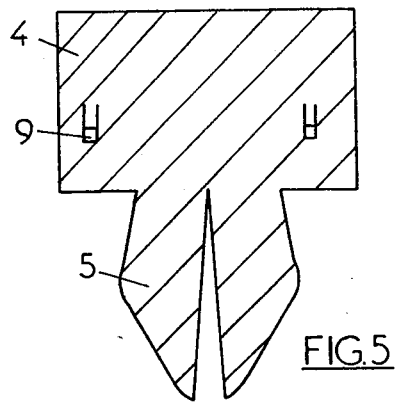
FIG. 5 is a sectional view of a junction piece taken along line V—V of FIG. 4.
Figure 14:
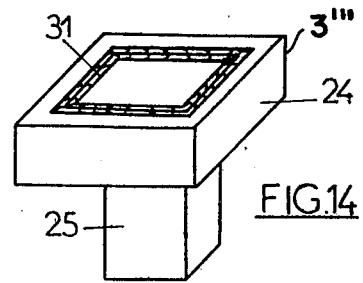
FIGS. 14 and 15 illustrate a variation of the embodiment of the junction piece shown in FIG. 4.
Figure 15:
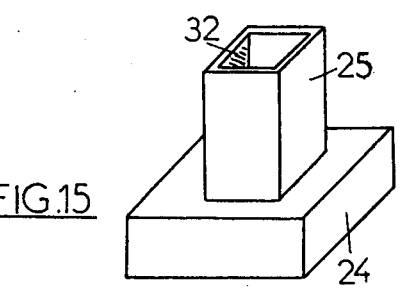
Figure 16:
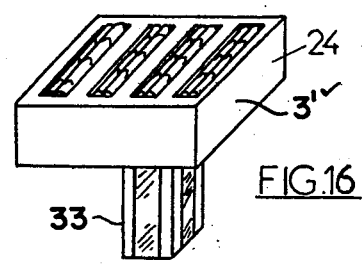
FIGS. 16, 17, 18 and 19 are the respective illustrations of further embodiments of junction pieces especially designed for electronic connections in the double faced mode.
Figure 17:
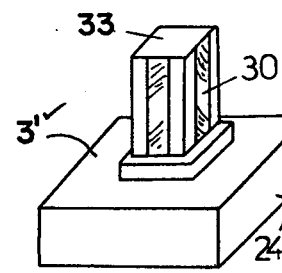
Figure 18:
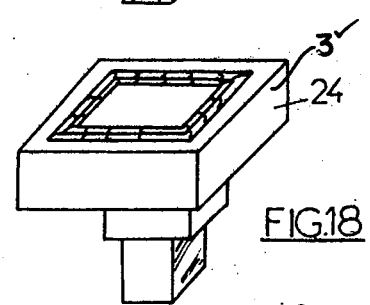
Figure 19:
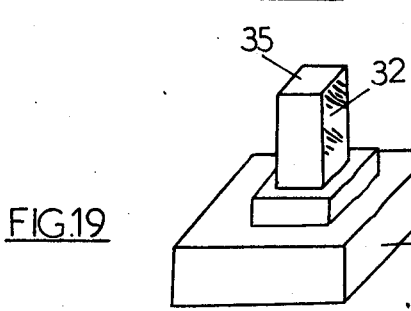
Figure 20:
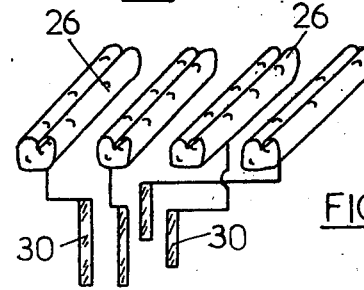
FIG. 20 is an exploded view illustrating the conducting structure of the junction piece shown in FIG. 8, as illustrated by FIGS. 16 and 17.
Figure 21:
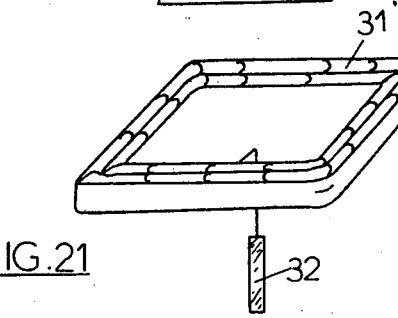
FIG. 21 is a similar exploded view representing the conducting structure of the junction piece shown in FIG. 4, as illustrated in FIGS. 18 and 19.

In the case of the junction piece $3^{III}$ illustrated on FIGS. 14, 15 and 21, its function is similar to that of the junction piece $3^I$ illustrated on FIGS. 4 and 5, but with the following differences.

In this case also, the separate connections 6 are replaced by a conducting peripheral bar 31, housed in the head 24 of the junction piece.

A conducting plate 32 is inserted on one of the internal faces of the attaching lug 25. This conducting plate may be made of metal and is connected by means of metal to the connecting bar 31 with which it forms a metal structure which is surrounded by the plastic material of the junction piece $3^{III}$.

The junction pieces $3^{II}$ and $3^{III}$ which have just been described on FIGS. 12 through 15 and 20, 21, are female junction pieces. The respective male junction pieces $3^{IV}$ and $3^V$ are illustrated on FIGS. 16 and 17 in the case of the junction piece $3^{IV}$, and on FIGS. 18 and 19 in the case of the junction piece $3^V$.

In the case of the latter, the only difference comes from the fact that the lug 33 is both square and solid, and that its dimensions enable it to penetrate smoothly in the attaching lug 25 of one of the above mentioned female junction pieces.

With this arrangement, FIG. 24 shows that it is possible to plug a male junction $3^{IV}$ or $3^V$ in one of the holes 22 of the plate 21, whereas a famale junction piece $3^{II}$ or $3^{III}$ is plugged in the opposite face and in the same hole. Therefore, the conducting bars 26 or 31 of the male junction piece $3^{IV}$ or $3^V$ are electrically connected to the conducting bars 26 or 31 of the female junction piece $3^{II}$ or $3^{III}$. The passage from one face of the plate 21 to the other is obtained by means of the conducting plates 30 or 32 of the attaching lug 25 of the junction element $3^{II}$ or $3^{III}$, and which are in contact with the plates 30 or 32 of the male square studs 35 of one of the male junction pieces $3^{IV}$ or $3^V$.

FIG. 23 illustrates a hinge piece 36 which completes the invented components.

The hinge piece 36 includes two square lugs 37 whose dimensions and spacing are directly related to the loops of the system of holes drilled in the plate 21. It is therefore possible to plug these square lugs 37 either in the holes 22 of the plate 21 or another plate 38, or in the female sleeve 55 provided along its perimeter. With this arrangement, it is possible to connect two hinge pieces 36, using a pin 39, in order to obtain the type of connection illustrated on FIG. 25. In this case, the hinge pin 36 connect a support plate 21 and another similar support plate 38 which define a variable angle 40. This system may be desirable in order to provide a console including components, as illustrated at 41, designed to display electro-luminescent digits.

FIG. 26 illustrates another application of an electronic kit according to the invention. In this case, the male lugs 24 (FIG. 11) of a support plate 42 are plugged in the holes 22 (FIG. 11) of another support plate 21 (FIG. 26). On the support plate 42, whose faces are thus made accessible, it is possible to obtain various electronical wiring connections with the junction pieces according to the invention. In particular, the following connections may be obtained.

A level 43 may be provided on one part of the upper face of the support plate 21. Another level, such 45 is provided on the front face of the support plate 42 and may be connected to the first level by means of an electrical wiring 44.

An additional level such as the one shown at 46 and schematically illustrated on FIG. 26, is actually located on the rear face 47 of the support plate 42 and may be connected to the level 45.

In conclusion, the invention offers the following advantages.

All of the components may be assembled by means of plugs, thus suppressing the need for soldering.

It is also possible to obtain "double face" patterns and still observe the accuracy of the theoretical systems drawn on paper.

The "double face" pattern avoids a quick saturation of the support plates such as those shown in FIGS. 25 and 26.

The connections allow for the strict observation of the theoretical patterns even in the case of the "double face."

What is claimed is:

1. A junction piece for use in conjunction with a kit apparatus for the construction of electrical circuits wherein said kit apparatus comprises a plate having a plurality of apertures arranged in a predetermined pattern therein and at least one electronic component, said junction piece comprising:
   a head portion comprised of a resilient material and having an upper surface and a lower surface opposite said upper surface;
   a first resilient lug formed integrally with said lower surface of said head portion and extending away therefrom;
   a second resilient lug formed integrally with said head portion and extending from said lower surface away therefrom in a spaced relationship with said first resilient lug, said first and second resilient lugs being selectively inserted together into at least one aperture of said plurality of apertures and being resiliently biased by a portion of said plate disposed around said at least one aperture such as to removably secure said junction piece to said plate; and
   selectively operable electrical interconnection means on said head portion for electrical interconnection with said at least one electronic component.

2. A kit apparatus comprising the junction piece of claim 1 and said plate.

3. The junction piece of claim 1 wherein said selectively operable electrical interconnection means are regularly spaced and located at a predetermined distance from the edge of said upper surface of said head portion.

4. The junction piece of claim 1 wherein said first and second resilient lugs together comprise a truncated cone having a longitudinal axis, said truncated cone being severed along a plane through said longitudinal axis.

5. The junction piece of claim 1 wherein said selectively operable electrical interconnection means comprises a plurality of electrical interconnection elements each electrically interconnected with each other to provide exactly one junction point.

6. The junction piece of claim 1 comprising a plurality of electrical interconnection elements each equally arranged in rows on said upper surface, said rows being parallel to each other.

7. The junction piece of claim 1 wherein said head portion and said first and second resilient lugs are formed of an electrically insulating material and wherein said selectively operable electrical interconnection means is formed of an electrically conductive material and further wherein said selectively operable electrical interconnection means comprises at least one contact piece and two metal lamellas electrically interconnected therewith so that said selectively operable electrical interconnection means allows the passage of electric current and the shape of each of said metal lamellas allows for mechanical attachment of said at least one electronic component.

8. The junction piece of claim 1 wherein said head portion is the shape of parallelepiped.

9. A junction piece for use in conjunction with a kit apparatus for the construction of electrical circuits wherein said kit apparatus comprises at least one plate having a plurality of polygonal apertures arranged in a predetermined pattern on said at least one plate, each of said plurality of polygonal apertures having a predetermined size, said junction piece comprising:
   a head portion having an upper surface and a lower surface disposed opposite said upper surface;
   selectively operable electrical interconnection means on said upper surface of said head portion, comprising at least one contact piece and two metal lamellas electrically interconnected to said at least one contact piece so that said selectively operable electrical interconnection means allows for the passage of electric current and the shape of each of said metal lamellas is such as to allow for mechanical attachment of electronic components thereto; and
   mechanical interconnection means extending from said lower surface of said head portion for selective insertion into at least one of said plurality of polygonal apertures.

10. The junction piece of claim 49 wherein said selectively operable electrical interconnection means further comprises several connecting bars on said head portion of said junction piece being arranged in parallel, wherein each of said connecting bars extends over approximately the whole length of said head portion of said junction piece, each of said connecting bars being also connected by means of conductors to at least one contact plate supported by said mechanical interconnection means, said contact plates being distributed around the perimeter of said mechanical interconnection means.

11. The junction piece of claim 9 wherein said electrical interconnection means comprises at least one connecting bar on said head portion of said junction piece, and wherein said junction piece further comprises at least one contact plate mechanically interconnected with said mechanical interconnection means and an electrical contact means electrically interconnecting each said at least one connecting bars with said at least one contact plate.

12. The junction piece of claim 9 wherein said plurality of apertures are rectangular, have a predetermined size, and extend through both opposing faces of said at least one plate, wherein said mechanical interconnection means comprises a rectangular parellelepiped lug and further wherein said rectangular parellelepiped lug is hollow and has an external cross section of no greater than said predetermined size so that said rectangular parallelepiped lug is selectively insertable into said plurality of polygonal apertures, said at least one contact piece being mounted on an internal surface of said rectangular parallelepiped lug.

13. The junction piece of claim 9 wherein said plurality of polygonal apertures are rectangular, have a predetermined size, and extend through both opposing faces of said at least one plate, wherein said mechanical interconnection means comprises a rectangular parallelepiped lug, and further wherein said rectangular parallelepiped lug has an external cross section substantially smaller than said predetermined size and said at least one contact piece is mounted on an external surface of said rectangular parallelepiped lug.

14. The junction piece of claim 9 wherein said mechanical interconnection means comprises a lug and wherein said at least one contact piece is supported by said lug and an electrical conducting means disposed around the periphery of said upper surface of said head portion and interconnected with said at least one contact piece.

15. The junction piece of claim 14 wherein said lug is hollow and rectangular in cross section and has at least one internal face and wherein said at least one contact piece fixed thereto is located on said at least one internal face of said lug.

16. The kit apparatus comprising the junction piece of claim 9 and said at least one plate.

17. A kit apparatus for the construction of electrical circuits, said apparatus comprising:
a primary plate;
a plurality of apertures on said primary plate arranged in a predetermined pattern and having a predetermined cross sectional shape;
a secondary plate;
a plurality of apertures on said secondary plate arranged in a predetermined pattern and having said predetermined cross sectional shape;
first mechanical interconnection means extending from said secondary plate for selective insertion into at least one preselected aperture of said plurality of apertures in said primary plate for interconnection therewith;
at least one junction piece for mechanical interconnection with either of said primary plate and said secondary plate;
a head portion of each said at least one junction piece;
selectively operable electrical interconnection means on said head portion for electrical interconnection with electronic components; and
second mechanical interconnection means extending from said head portion for selective insertion into at least one preselected aperture of said plurality of apertures in said primary and secondary plates.

18. The kit apparatus of claim 17 wherein said primary plate comprises an upper surface and at least one peripheral surface, said plurality of apertures being in said upper surface and in said peripheral surface, whereby said secondary plate may be selectively interconnected with at least one preselected aperture of said apertures in said upper surface and may alternatively be selectively interconnected with said at least one preselected aperture of said apertures in said peripheral surface.

19. The kit apparatus of claim 17 wherein said secondary plate is provided with two opposite faces, each aperture of said plurality of apertures extending through both of said two opposite faces.

20. A kit apparatus for the construction of electrical circuits having at least one electronic component, said kit apparatus comprising:
a plate having an upper surface and a lower surface;
a plurality of apertures in said plate extending through said plate between said upper surface and said lower surface;
at least one female junction piece for mechanical interconnection with said plate;
at least one male junction piece for mechanical interconnection with said plate;
a head portion on each of said at least one female and at least one male junction pieces;
selectively operable electrical interconnection means on each of said head portions;
a female lug extending from said head portion of said at least one female junction piece for selective insertion into at least one of said plurality of apertures from one surface of said upper and lower surfaces of said plate; and
a male lug extending from said head portion of said at least one male junction piece for selective insertion from the other surface of said plate opposite said one surface, said female lug and said male lug being dimensioned such that said male lug is inserted at least partially into said female lug when said head portions abut said upper and lower surfaces, said at least one male junction piece and said at least one female junction piece permitting double face wiring.

21. The kit apparatus of claim 20 wherein each said selectively operable electrical interconnection means further comprises a contact plate supported by the lug of said male and female lug associated therewith and a peripheral conducting bar on said head portion, said peripheral conducting bar being electrically interconnected with said contact plate.

22. The kit apparatus of claim 21 wherein said female lug of said at least one female junction piece is hollow and rectangular in cross section and has at least one internal face, said contact plate affixed thereto being located on said at least one internal face.

23. The kit apparatus of claim 20 wherein said head portion of each of said at least one male junction piece and at least one female junction piece has an upper surface opposite said male and female lugs and further wherein said selectively operable electrical interconnection means are regularly spaced and located at a predetermined distance from the edge of said upper surface of said head portion.

24. The kit apparatus of claim 20 wherein all of said electrical interconnection means are selectively operable electrically interconnected by exactly one conductor.

25. The kit apparatus of claim 20 wherein said selectively operable electrical interconnection means comprises a plurality of electrical interconnections which are equally arranged in rows that are parallel to each other on the portion of said head portion remote from said male and female lugs.

26. The kit apparatus of claim 20 wherein said head portion and said male and female lugs are formed of an electrically insulating material and wherein said selectively operable electrical interconnection means is formed of an electrically conductive material and further wherein said selectively operable electrical interconnection means comprises at least one contact piece and two metal lamellas electrically interconnected therewith so that said selectively operable electrical interconnection means allows the passage of electric current and the shape of said lamellas allows for mechanical attachment of said at least one electronic component.

27. The kit apparatus of claim 20 wherein said selectively operable electrical interconnection means of at least one junction piece of said at least one male junction piece and said at least one female junction piece further comprises several connecting bars on said head portion of said at least one junction piece being arranged in parallel and each extends over approximately the whole length of said head portion of said at least one junction piece, each of said several connecting bars being also connected by means of conductors to at least one contact plate supported by the associated lug of said male and female lugs associated with said at least one junction piece, said contact plates being distributed around the perimeter of said associated lug.

28. The kit apparatus of claim 57 wherein said second mechanical interconnection means further comprises at least two lugs whose dimensions and spacings are suitable for selective insertion of each of said at least two lugs into one of said plurality of apertures of either of said primary plate and said secondary plate, so that said at least two lugs can be plugged into said plurality of apertures in said primary plate and said secondary plate for use in conjunction therewith.

29. The kit apparatus of claim 28 wherein:
said head portion has an upper surface and a lower surface parallel to said upper surface;
said at least two lugs extend from said lower surface of said head portion away from said lower surface and said upper surface thereof; and
said selectively operable electrical interconnection means are generally provided on said upper surface of said head portion.

* * * * *

UNITED STATES PATENT AND TRADEMARK OFFICE
CERTIFICATE OF CORRECTION

PATENT NO. : 4,457,721
DATED : July 3, 1984
INVENTOR(S) : Patrice Charvolin

It is certified that error appears in the above-identified patent and that said Letters Patent is hereby corrected as shown below:

Column 2, line 8, delete "abtained" and insert ---- obtained ----.

Column 4, line 42, delete "$3^{II}$" and insert ---- pieces $3^{IV}$ -----.

Column 4, line 53, delete "famale" and insert ---- female ----.

Column 5, line 22, delete "such".

In the Claims

Column 6, line 59, delete the numeral "49" and insert the numeral ---- 9 ----.

Column 10, line 11, delete the numeral "57" and insert the numeral ---- 17 ----.

Signed and Sealed this

Twelfth Day of March 1985

[SEAL]

Attest:

DONALD J. QUIGG

Attesting Officer   Acting Commissioner of Patents and Trademarks